United States Patent [19]
Kim et al.

[11] Patent Number: 5,844,253
[45] Date of Patent: Dec. 1, 1998

[54] HIGH SPEED SEMICONDUCTOR PHOTOTRANSISTOR

[75] Inventors: Gyung Ock Kim; Dong Wan Roh, both of Daejon-shi, Rep. of Korea

[73] Assignee: Electronics and Telecommunications Research Institute, Daejon-shi, Rep. of Korea

[21] Appl. No.: 954,738

[22] Filed: Oct. 20, 1997

[30] Foreign Application Priority Data

Nov. 22, 1996 [KR] Rep. of Korea ................... 1996 56550

[51] Int. Cl.$^6$ ....................................................... H01L 29/06
[52] U.S. Cl. .................................... 257/24; 257/14; 257/5
[58] Field of Search .................................. 257/12, 14, 5, 257/25, 565, 577, 586, 197, 184

[56] References Cited

U.S. PATENT DOCUMENTS

| | | | |
|---|---|---|---|
| 5,047,810 | 9/1991 | Chemla et al. | 357/4 |
| 5,077,593 | 12/1991 | Sato et al. | 357/30 |
| 5,266,814 | 11/1993 | Inata et al. | 257/25 |
| 5,389,804 | 2/1995 | Yokoyama et al. | 257/25 |
| 5,447,873 | 9/1995 | Randall et al. | 257/25 |
| 5,606,178 | 2/1997 | Schulman et al. | 257/25 |
| 5,705,825 | 1/1998 | Ando | 257/25 |

FOREIGN PATENT DOCUMENTS

| | | |
|---|---|---|
| 0638 941 A2 | 8/1994 | European Pat. Off. . |
| 0 638 941 A2 | 2/1995 | European Pat. Off. . |

OTHER PUBLICATIONS

Victor Ryzhii and Maxim Ershov, "Hot Electron Effects in Infrared Multiple–Quantum–Well Phototransistor", Feb., 1995, pp. 1257–1259.

Victor Ryzhii and Maxim Ershov, "Electron Density Modulation Effect in a Quantum–Well Infrared Phototransistor", Jul. 15, 1995, pp. 1214–1218.

L.C. Lenchyshyn, H.C. Liu, M. Buchanan and Z.R. Wasilewski, "Voltage–Tuning in Multi–Color Quantum Well Infrared Photodetector Stacks", May 15, 1996 pp. 8091–8097.

C.J. Chen, C. Kurdak, D.C. Tsui and K.K. Choi, "Separation of Partition Noise from Generation–Recombination Noise in a Three–Terminal Quantum Well Infrared Photodetector", Apr. 26,1996, pp. 2535–2537.

A.F.J. Levi and T.H. Chiu, "Room Temperature Operation of Hot–Electron Transistors", Sep. 28, 1987, pp. 984–986.

K. Funato, K. Taira, F. Nakamura and H. Kawai, "Thermionic Emission of T and L Electrons in the GaSb/InAs Hot–Electron Transistors", Sep. 30, 1991, pp. 1714–1716.

*Primary Examiner*—David B. Hardy
*Attorney, Agent, or Firm*—Cohen, Pontani, Lieberman & Pavane

[57] ABSTRACT

The present invention relates to an ultra-high speed semiconductor phototransistor which comprises a substrate. A conductive collector layer, on which a collector electrode is formed, is formed on the substrate. A collector barrier layer for collector electric potential is formed on the conductive collector layer. A conductive base layer, on which a base electrode is formed, is formed on the collector electric potential barrier layer. An emitter barrier layer for emitter electric potential is formed on the conductive base layer for injecting hot-electrons onto the conductive base layer. The emitter barrier layer for emitter electric potential further comprises various sizes of quantum-dot array combination structures for absorbing an infrared ray. A blocking barrier layer positioned beneath the quantum-dot array combination structures reduces a dark current passed through the quantum-dot array combination structure. A second buffer layer positioned beneath the blocking barrier layer absorbs an electric potential change in the quantum-dot array combination structure due to the applied voltage. A conductive emitter layer, on which an emitter electrode is formed, is formed on the emitter barrier layer for emitter electric potential.

17 Claims, 3 Drawing Sheets

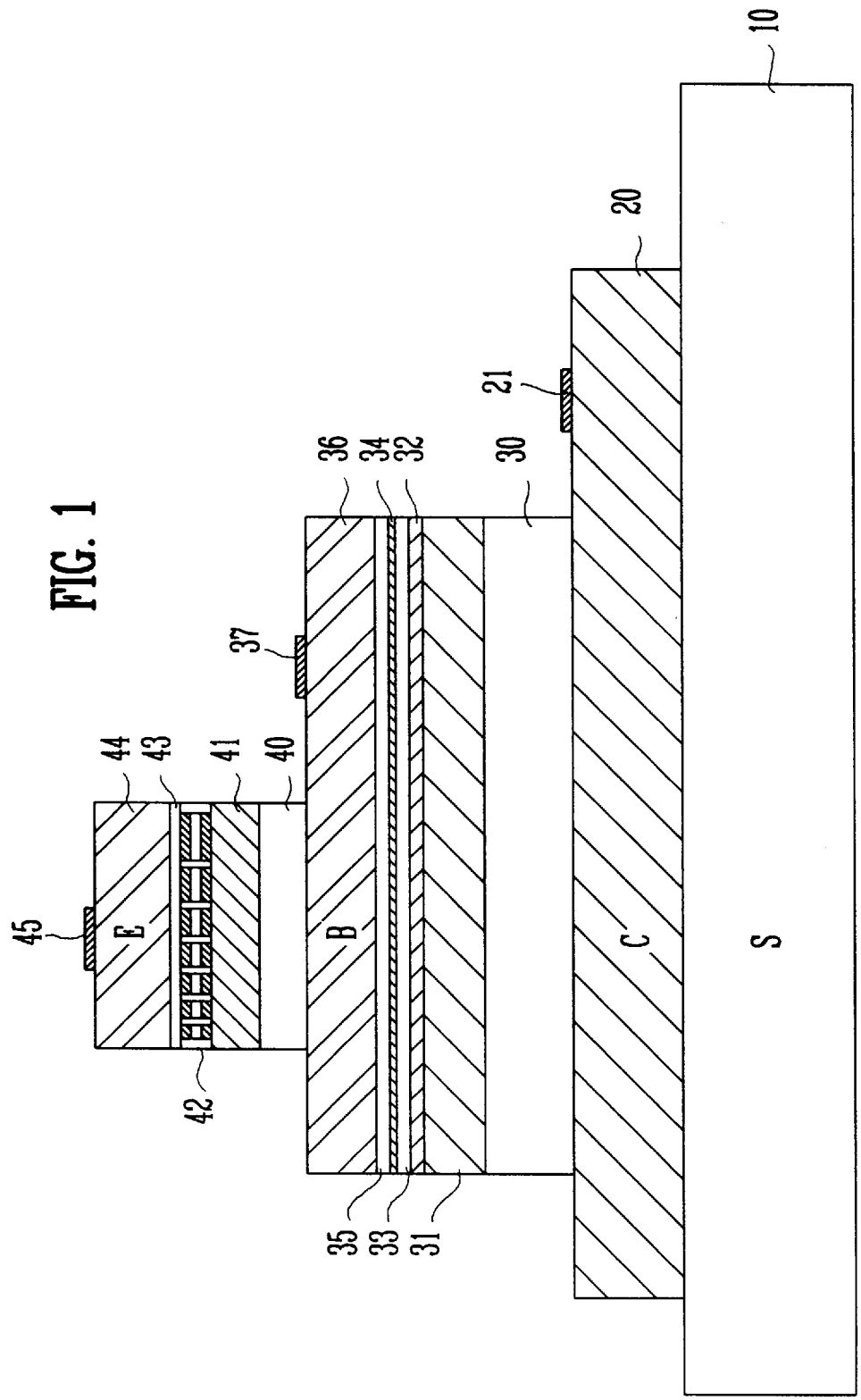

HIGH SPEED SEMICONDUCTOR PHOTOTRANSISTOR

BACKGROUND OF THE INVENTION

1. Field of the Invention

The present invention relates to an ultra-high speed semiconductor device, more particularly to a hot electron phototransistor structure.

2. Description of the Related Art

Recently, as a semiconductor developing technologies, such as for example, of a molecule beam epitaxy method, a metal organic chemical deposition method and etc., is improved, the development of the semiconductor phototransistor which utilizes semiconductor heterostructures is mostly given.

In structures of quantum-well heterostructures such as, GaSb/InAs, InAs/ZnTe, GaAs/Al(Ga)As, InGaAs/InAlAs/InP, quantum wires or quantum dots, studies have briskly been made to the phenomenon which absorbs or emits light of infrared regions by the transition of the electron between quantum-confined states of electrons or positive holes, the resonant tunneling effect of the electrons through the quantum-confined states and the ultra-high speed transport of hot-electrons in the heterostructures. Further, studies have also been made in order to incorporate the ultra-high speed electron transport using a very short transition time of the hot-electron in the transistor structure and a high speed infrared photodetection and generation utilizing the intersubband transition of the electrons.

The use of the resonant tunneling effect and the very short transition time of the hot-electron causes Tera-Hz semiconductor device to be possibly operable. Electron devices such as, Hot Electron Transistor (HET), Resonant Tunneling Hot Electron Transistor (RHET) or Resonant Tunneling Diode (RTD), which use the above effect are the devices which may be operated at Tera-region(original infrared region). Using junction quantum-well heterostructure, quantum wire or quantum dot structure, the most interest has been focused on the tunable voltage-controlled photodetector having the infrared photon absorption, detection and generation function, and the Hot Electron Phototransistor (PHT) which uses the high speed transition time of the hot-electron at the base region. Especially, the use of the resonant tunneling effect of the electrons through the quantum-confined states, and the transition phenomenon of the electron between quantum-confined states, which respectively have an ultra-high speed characteristics, has an important parameter for the applications of an ultra-high speed switching device, logic device or the like.

Reference may also be made to EPO Patent Serial No. 638,941, entitled "Phototransistor with quantum-well base structure", U.S. Pat. No. 5,077,593, entitled "Dark current-free multi-quantum-well superlattice infrared detector" and U.S. Pat. No. 5,047,810, entitled "Optically controlled resonant tunneling electronic devices", which relates to the electron devices using the infrared photon absorption effect in the barrier structure of the semiconductor heterostructure, and disclose the operational principle, its application and the feature improvement of the electron devices for the phototransistor and the photodetector. These devices are the same features in that the infrared photon detection is made using the transition of the electron between quantum-confined states in the semiconductor hetrostructure according to the present invention.

References may be made to related articles as follows: "Hot-electron effect in infrared multiple-quantum-well photo-transistor," J. of Applied Physics, Part 1, Volume 34, pp 1257, Japan (1257), by V. Ryzhii, et al., which discloses the increase in current gain by rearranging the potential due to the light absorption, and the injection and transfer of the Hot Electron in the Hot Electron Transistor(HET) which introduces the multi-quantum-well structure into the base region; "Electron density modulation effect in a quantum-well infrared photo-transistor," J. of Applied Physics, Volume 68, pp 2854, Japan (1995), by V. Ryzhii, et al., which discloses the effect by the modulation of electron density due to the light absorption, that is, the increase in dark current, optical current, reactivity and sensitivity, in the Hot Electron Transistor (HET) which introduces a single quantum-well structure into the base region; "Voltage-tuning in multi-color quantum-well infrared photo-detector stacks," J. of Applied Physics, Volume 79, pp 8091, USA (1996), by L. Lenchyshyn, et al., which discloses an article regarding studies of the color adjustment by the voltage, series resistance, copper resistance and so on, in the Photodetector which introduces series stack of the quantum-well structure being color center; "Separation of partition noise from generation-recombination noise in a three-terminal quantum-well photodetector," J. of Applied Physics, Lett. 68, pp 2535, USA (1996), by C. Chen, et al., which discloses a noise in a three-terminal quantum-well infrared photodetector base; "Room-temperature operation of hot electron transistors," USA Applied Physics, Lett. 51, pp 984 (1987), by Levi, A, et al., which discloses a hot electron device constituted with $AlSb_{0.92}As_{0.08}$ emitter and 100 Angstroms InAs base; and "Thermionic emission of T and L electrons in GaSb/InAs hot electron transistors," Applied Physics, Lett. 59, pp 1714, Japan (1991), by Finite, K, et al., which discloses a T-valley and L-valley electrons injection in GaSb/InAs hot electron devices. These articles represent the same features as the present invention in that the infrared ray detection is made using the hot electron effect in the semiconductor heterostructures and the transition of the electron between quantum-confined states.

However, although these preceding patents and associated articles proposes applications of quantum-well heterostructures, the features such as, a wide range of an infrared photon detecting function, an improvement of resolution in detected infrared wavelength, and a selection, amplification and process of normal infrared frequency using a resonant tunneling quantum-well structure and a blocking barrier are proposed.

Therefore, it is an object of the present invention to overcome the above disadvantages and provide an ultra-high speed semiconductor phototransistor, which is capable of improving performance of a hot electron infrared device by providing a wide range of an infrared photon detecting function, an improved resolution in detected infrared wavelength, and a selection, amplification and process of normal infrared frequency using a resonant tunneling double-barrier quantum-well structure and a blocking barrier, thereby deriving the reduction of dark current.

To this end, the present invention provides an improved hot electron photo-transistor (HEPT) for providing a wide range of an infrared photon detecting function, an improved resolution in detected infrared wavelength by the application of an array combination of various sizes of the quantum dots or the quantum wires with an electron injecting barrier of the emitter, and a selection, amplification and process of normal infrared frequency using a resonant tunneling quantum-well structure and a blocking barrier to thereby derive the reduction of dark current in the hot electron infrared electron device (HET) structure.

The quantum-confined states of the electrons of quantum wires or quantum dots are controlled depending on the width of the quantum wires or the size of the quantum dots, which determine the absorption of the infrared wavelength and thereby the injecting energy of the hot electron. Here, various quantum-confined states occur by providing the combination of various sizes of the quantum dots or the quantum wires, such that the flexibility of the control and selection of the absorption of the infrared photons increases and a wide range of the absorption of the infrared photons can be obtained. Especially, due to the transition of the electron between quantum-confined states which are sharpen in the quantum dots, the resolution for the absorbed infrared wavelength is improved. Further, the electrons which are excited by the infrared ray absorbed in the combination of various sizes of the quantum dots are injected into the base layer. And it are possible to use a very short transition time of the hot electrons which are injected onto the base layer and to control the absorption frequency to be amplified. The resonant tunneling double-barrier quantum-well structure and a blocking barrier can be contributed to the application of the ultra high speed tunable infrared signal detecting and amplifying device, and switching and logic device.

In order to achieve the object of the present invention as mentioned above, the combination of various sizes of the quantum dots or various widths of the quantum wires, the blocking barrier of the electrons and the buffer layer are applied as an emitter barrier structure between conductive emitter layer and conductive base layer. The conduction-band minimum between the electric potential barrier layer of the base layer is lower than those of the emitter barrier and collector barrier, and the conductive base layer having a high electron-mobility is provided. The spacer layer and the resonant tunneling double-barrier structure (that is, quantum-barrier layer, quantum-well layer and quantum-barrier layer), the blocking barrier of the electron, the undoped wide spacer layer (electric potential variation absorbing layer) is provided as an collector barrier structure between a base layer and a collector layer.

When applying an external voltage, the tunneling of the electrons occurs inside the quantum dots or the quantum wires at the emitter side, and the transition of the electron between quantum-confined states occur due to the infrared photon absorption.

The electrons which are excited by the absorption of the infrared then move through the barrier layer to the base layer due to the potential difference between the emitter layer and the collector layer, such that the injection of the hot electron is made into the base region. The electrons injected onto the base layer are transmitted therethrough, then selected by the resonant tunneling double-barrier quantum-well structure of the collector barrier, and consequently reach the collector layer. That is, the electrons excited by a predetermined infrared frequency are filtered in accordance with the quantum-confined states and the external voltages. The quantum-well blocking barrier layer subsequent to the resonant tunneling double-barrier structure is then contributed to reduce the dark current. In the emitter barrier structure having a function of infrared photon detection (absorption), the energy changes and broadening of the quantum-confined states due to the potential drop when external voltage is applied and the changes and broadening in the absorbing frequency of light accordingly can be controlled in accordance with the width of the buffer layer for electric potential change (i.e., buffer or spacer layer). Here, it should be noted that inclusion of the quantum-well blocking barrier layer subsequent to the infrared photon absorbing structure can act to prevent the dark current from being occurred.

SUMMARY OF THE INVENTION

An ultra-high speed semiconductor phototransistor according to the present invention is defined by the claims with a specific embodiment shown in the attached drawings. For the purpose of summarizing the present invention, ultra-high speed semiconductor device according to the present invention is provided which comprises a substrate. A conductive collector layer, on which a collector electrode is formed, is formed on the substrate. A collector barrier layer is formed on the conductive collector layer. A conductive base layer, on which a base electrode is formed, is formed on the collector barrier layer. An emitter barrier layer is formed on the conductive base layer for injecting hot-electrons onto the conductive base layer. The emitter barrier layer further comprises various sizes of quantum-dot array combination structures for absorbing infrared photons.

A blocking barrier layer positioned beneath the quantum dot array combination structures reduces a dark current passed through the quantum dot array combination structure. A second layer or while spacer layer positioned beneath the blocking barrier layer for absorbing electric potential change reduces an electric potential change inside the quantum dot array combination structure, due to the applied voltage drop. A conductive emitter layer, on which an emitter electrode is formed, is then formed on the emitter barrier layer.

BRIEF DESCRIPTION OF THE DRAWINGS

For fuller understanding of the nature and objects of the invention, reference should be made to the following detailed description taken in conjunction with the accompanying drawings in which:

FIG. 1 shows a cross sectional view representing a hot electron photo-transistor structure according to an embodiment of the present invention;

Figure 2A:
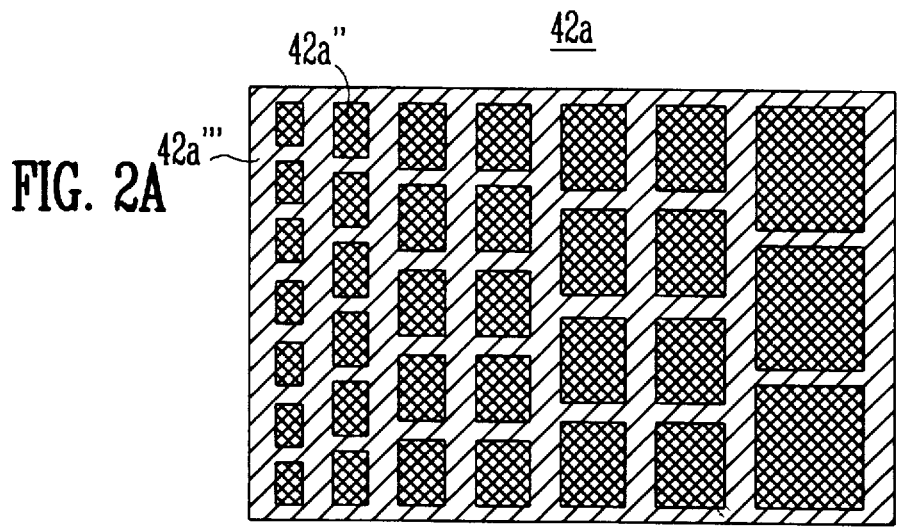
FIGS. 2A and 2B illustrate a horizontal and cross sectional views which represent a quantum dot array combination structure applied to the structure of an emitter barrier in FIG. 1 according to the present invention.

The operation of the embodiment of the present invention as discussed above will now be described in detail.

The similar reference characters refer to similar parts in the several views of the drawings.

DETAILED DESCRIPTION OF THE INVENTION

Referring now to FIG. 1, it shows a cross sectional view representing a hot electron photo-transistor structure according to an embodiment of the present invention;

In the figure, a conductive collector layer 20, on which a collector electrode 21 is formed, are formed on a substrate 10. A first buffer layer for reduction of the electric potential change 30 (i.e., undoped buffer or wide spacer layer), a blocking barrier layer 31, a quantum-barrier layer 32, a quantum-well layer 33, a quantum-barrier layer 34, a first spacer layer 35 and a conductive base layer 36, on which a base electrode 37 is formed, are sequentially formed on the substrate 10. Further, a second buffer layer for the reduction of the electric potential change 40 (i.e., undoped buffer or wide spacer layer), a blocking barrier layer 41, a various size of quantum dot array combination structure or various line width of quantum wire array combination structure 42, a second spacer layer 43 and a conductive emitter layer 44, on which an emitter electrode 45 is formed, are also sequentially formed on the conductive base layer 36.

Here, a collector barrier layer 30 defines a resonant tunneling double-barrier quantum-well structure 30 for passing through the double-barrier quantum-well confined states only the electrons, which were excited by a predetermined frequency in the emitter barrier region, blocking barrier layer 31 formed above the resonant tunneling double-barrier quantum-well structure 30 for reducing the dark current passed through the resonant tunneling double-barrier quantum-well structure 30, and first buffer 32 layer formed above the blocking barrier layer 31 for the purpose of reducing the electric potential change inside the resonant tunneling double-barrier quantum-well structure 30.

In the meantime, an emitter barrier structure formed on the conductive base layer for injecting hot-electrons onto the conductive base layer defines a various size of quantum dot array combination structures or a various line width of quantum wire array combination structure 42 for absorbing infrared photons, blocking barrier layer 41 formed beneath the quantum dot array combination structure 42 for reducing a dark current passed through the quantum dot array combination structure 42 and second buffer layer for electric potential change 40 formed beneath the blocking barrier layer 41 for reduction of an electric potential change due to the voltage drop inside the quantum dot array combination structure 42. The resonant tunneling double-barrier structure 42 may be substituted with at least two or more quantum-well structures instead. Further, the resonant tunneling double-barrier structure may also be substituted with the various size of quantum dot array combination structure or various line width of quantum wire array combination structure.

An example which applies the emitter barrier structure with the various size of quantum dot array combination structure as shown in FIG. 1 will be described in connection with FIGS. 2A and 2B hereinafter.

Figure 2B:
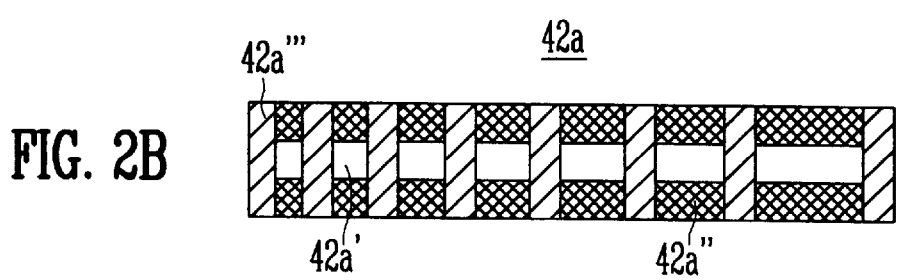

FIGS. 2A and 2B illustrate a horizontal and cross sectional views which represent a quantum dot array combination structure applied to the structure of an emitter barrier in FIG. 1.

As shown in the drawings, the quantum dot array combination structure 42a is constituted with a quantum barrier 42a", various sizes of quantum dots 42a' and an insulating layer 42a''', which have a function of an infrared photon detection (absorption). Such the quantum dot array combination structure 42a can be configured with a horizontal, vertical combination. The horizontal sectional view of FIG. 2A represents the characteristics of the various sized quantum dot array combination structure.

Furthermore, an example which applies the emitter barrier structure with the various linewidth of quantum wire array combination structure as shown in FIG. 1 will be described in connection with FIGS. 3A and 3B hereinafter.

Figure 3A:
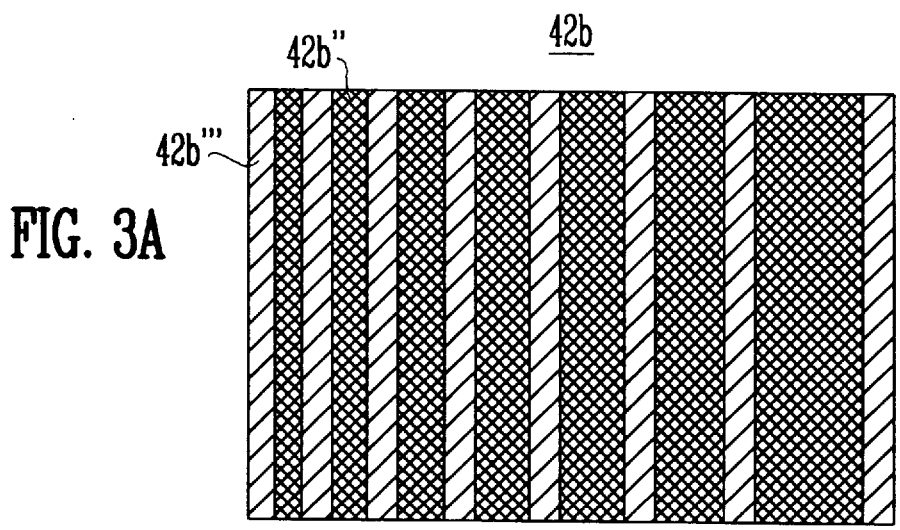
FIGS. 3A and 3B illustrate a horizontal and cross sectional view which represent a quantum wire array combination structure applied to the structure of an emitter barrier in FIG. 1 according to the present invention.
Figure 3B:
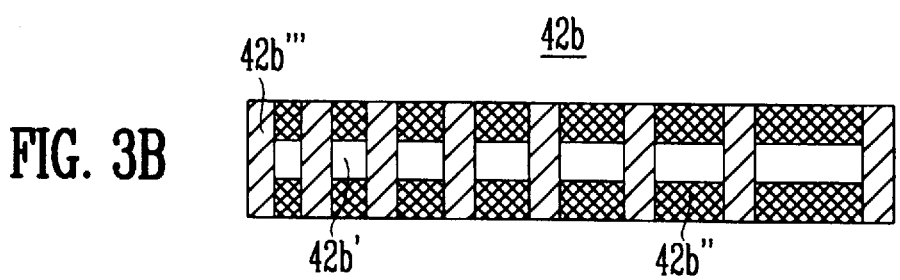

In FIGS. 3A and 3B, they illustrate a horizontal and cross sectional views which represent a quantum wire array combination structure applied to the structure of an emitter barrier in FIG. 1. As shown in the figures, the quantum wire array combination structure 42b is constituted with a quantum barrier 42b", various linewidths of quantum wire 42b', a quantum-barrier layer 42b", and an insulating layer 42b''' which have a function of an infrared photon detection (absorption). Such the quantum wire array combination structure 42b can also be configured with a horizontal, vertical combination. The horizontal sectional view of FIG. 3A represents the characteristics of the various widths of quantum wire array combination structure.

Based on the above two embodiments, the compound array combination structure may be accomplished by constructing the emitter barrier structure with the various size of quantum dot array combination structure and the various linewidth of quantum wire array combination structure.

Figure 4:
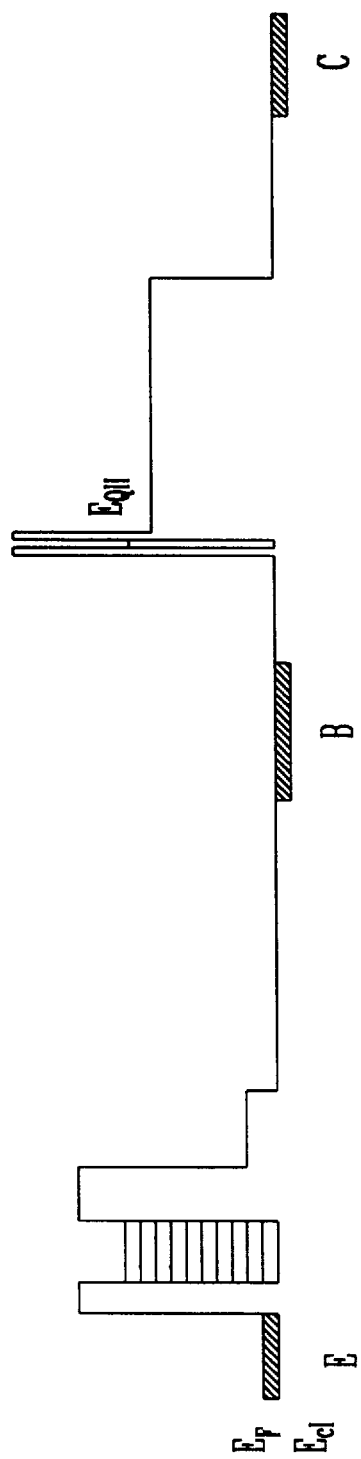
FIG. 4 shows a schematic energy band diagram of the constituting layers of a hot electron photo-transistor structure in absence of the applied voltage according to the present invention.
Figure 5:
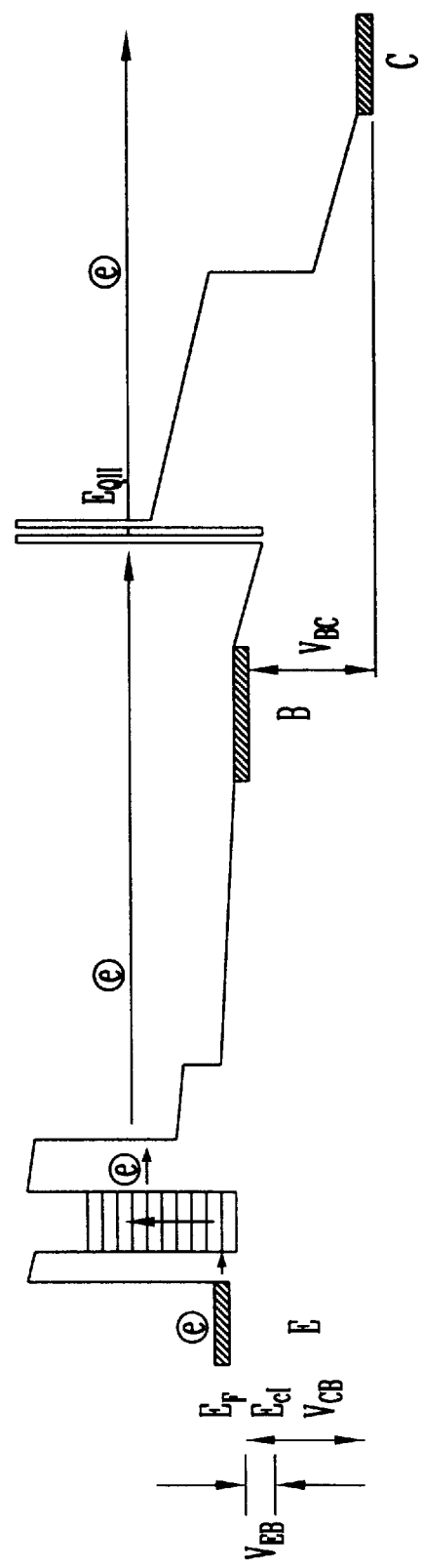
FIGS. 5 shows schematic energy band diagrams of operational states of a hot electron photo-transistor device in applying the various types of voltage, Veb, Vbc and Vec according to the present invention.

FIGS. 4 and 5 show schematic energy band diagrams representing the conduction band in the respective layers under the respective voltages in the hot electron photo-transistor device (HEPT) in which the operational states of a hot electron photo-transistor device (HEPT) in applying the various types of Veb (Emitter-Base Voltage), Vbc (Base-Collector Voltage) and Vec (Emitter-Collector Voltage) according to the present invention are shown.

FIG. 4 represents a schematic energy band diagram of a constituting layers of a hot electron photo-transistor structure in absence of the voltage according to the present invention.

In FIG. 5, it is an example of the operational states of a hot electron photo-transistor device (HEPT) in applying one types of Veb (Emitter-Base Voltage) and Vbc (Base-Collector Voltage) and Vec (Emitter-Collector Voltage). This explains that when applying Veb, the tunneling of the electrons at the emitter layer occurs inside the quantum dot array combination structure 42a due to the resonant tunneling of the electrons, and the transition of the tunneled electrons in the quantum dot array combination structure 42a occurs between the quantum-confined states by the absorption of the infrared photon. At the time, the electrons which are excited by the absorption of the infrared photons are then moved through the barrier, blocking barrier and buffer layer 40 (i.e., undoped buffer or wide spacer layer) such that the injection of the hot electron is made into the base region. The resonant tunneling electrons passed through the quantum-confined states ($E_{Q11}$) of the resonant tunneling double-barrier quantum-well structure 30 comprised of the quantum-barrier layer 32, the quantum-well layer 33 and the quantum-barrier layer 34 among the electrons passed through the base layer 36 are then selected and consequently reach the collector layer. That is, the electrons excited by a predetermined infrared frequency are filtered in accordance with the quantum-confined states of the resonant tunneling double-barrier quantum-well structure 30 and the blocking barrier layer 31. At this time, the blocking barrier layer 31 is then contributed to reduce the dark current.

As mentioned above, by providing the various sizes of the quantum dot combinations, the flexibility of the control and selection of the absorption of the infrared ray region increases and a wide range of the absorption of the infrared ray region can be obtained. Here, the similar effects can also be obtained by using the quantum wire array combination structure 42b, instead of using the quantum dot array combination structure 42a. Further, the buffer layer for reducing electric potential change 40 (i.e., undoped buffer or wide spacer layer) acts to reduce the electric potential change in the infrared photon detection quantum dot combination, the quantum wire structure, or the collector resonant tunneling double-barrier quantum-well structure due to the applied voltage drop. Since the width of the buffer layer and the blocking barrier layer can be flexibly applied, the energy changes and broadening of the quantum-confined states due to the voltage drop and the changes and broadening in the absorbing frequency of light due to thereby can be adjusted.

The asymmetrical structure of the blocking barrier layer according to the present invention has a sharp reduction effect in the electrons excited by the infrared photon below a predetermined frequency and the dark current of predetermined frequency as compared to the symmetrical double barrier resonant tunneling structure according to the prior art. The buffer layer for absorbing electric potential change (i.e., undoped buffer layer) can be positioned after and before the resonant tunneling double barrier quantum-well structure, respectively. In the collector barrier structure for infrared frequency selection, the quantum dots or the quantum wire array combination structure can be utilized instead of using the collector double-barrier resonant tunneling quantum-well structure and thus, the flexibility thereof can also improved.

As explained above, according to the present invention, it can propose to provide a wide range of infrared photon detecting function, an improved resolution in detected infrared wavelength by the application of an array combination of various sizes of the quantum dots or the quantum wires with an electron injecting barrier of the emitter, and a selection, amplification and process of normal infrared frequency using a resonant tunneling quantum-well structure and a blocking barrier to derive the reduction of dark current in the hot electron infrared device (HET) structure. By applying the present invention as mentioned above, it can be contributed to the application of the ultra high speed tunable infrared signal detecting and amplifying device, the ultra high speed switching and digital logic device having a novel function, and the novel ultra high speed digital logic functioning device which can reduce the number of the logic elements. The control and selection of the absorption of the wide range of the infrared photon can be obtained due to the flexibility of providing the various sizes of the quantum dots array and combinations.

Although the present invention and its advantages have been described in detail, it should be understood that various changes, substitutions and alterations can be made herein without departing from the spirit and scope of the invention as defined by the appended claims. It is therefore intended by the appended claims to cover any and all such applications, modifications, and embodiments within the scope of the present invention.

What is claimed is:

1. An ultra-high speed semiconductor phototransistor comprising:
   a substrate;
   a conductive collector layer having a collector electrode and formed on said substrate;
   a collector barrier layer formed on said conductive collector layer;
   a conductive base layer having a base electrode and formed on said collector barrier layer; and
   an emitter barrier layer formed on said conductive base layer for injecting hot-electrons into said conductive base layer, said emitter barrier layer further comprising:
      various sizes of quantum dot array combination structures for absorbing an infrared ray;
      a blocking barrier layer positioned beneath said quantum dot array combination structures for reducing a dark current passed through said quantum dot array combination structure;
      a buffer layer positioned beneath said blocking barrier layer for reducing an electric potential change due to a voltage drop when external voltage is applied in said quantum dot array combination structure; and
      a conductive emitter layer having an emitter electrode and formed on said emitter barrier layer.

2. The ultra-high speed semiconductor device according to claim 1, wherein said quantum dot array combination structures are constituted with a horizontal, vertical combination.

3. The ultra-high speed semiconductor phototransistor according to claim 1, wherein said buffer layer has a width which can be adjusted for absorbing a change in the electric potential of one of an infrared photon detection quantum dot array combination structure, a quantum wire array combination structure and a collector resonant tunneling double-barrier quantum-well structure.

4. An ultra-high speed semiconductor phototransistor comprising:
   a substrate;
   a conductive collector layer having a collector electrode and formed on said substrate;
   a conductive barrier layer formed on said conductive collector layer, said collector barrier layer further comprising:
      a resonant tunneling double barrier structure for passing through the double-barrier quantum-well confined states only electrons, which have been excited by a predetermined frequency in the emitter barrier region;
      blocking barrier layer positioned beneath said resonant tunneling double-barrier structure for reducing a dark current passed through said resonant tunneling double-barrier structure; and
      a first buffer layer for absorbing electric potential change, said first buffer layer positioned beneath said blocking barrier layer for reducing an electric potential change in said resonant tunneling double-barrier structure;
   a conductive base layer having a base electrode and formed on said collector electric potential barrier layer;
   an emitter barrier layer formed on said conductive base layer for injecting hot-electrons into said conductive base layer, said emitter barrier layer further comprising:
      various sizes of quantum dot array combination structures for absorbing an infrared ray;
      a blocking barrier layer positioned beneath said quantum dot array combination structures for reducing a dark current passed through said quantum dot array combination structure;
      a second buffer layer positioned beneath said blocking barrier layer for absorbing electric potential change for reducing an electric potential change due to a voltage drop when external voltage is applied in said quantum dot array combination structure; and
   a conductive emitter layer having an emitter electrode and formed on said emitter barrier layer.

5. The ultra-high speed semiconductor device according to claim 4, wherein said collector barrier layer further comprises a spacer layer on said resonant tunneling double-barrier structure for allowing the tunneling by the electrons passed through said conductive base layer.

6. The ultra-high speed semiconductor device according to claim 4, wherein said quantum dot array combination structures are constituted with a horizontal, vertical combination.

7. The ultra-high speed semiconductor device according to claim 4, wherein at least two or more quantum-well structures are used instead of said resonant tunneling double-barrier structure.

8. The ultra-high speed semiconductor device according to claim 4, wherein a quantum-well structure is used instead of said resonant tunneling double-barrier structure.

9. The ultra-high speed semiconductor phototransistor according to claim 4, wherein said first and second buffer layers have widths which can be adjusted for absorbing a change in the electric potential of one of an infrared photon detection quantum dot array combination structure, a quantum wire array combination structure and a collector resonant tunneling double-barrier quantum-well structure.

10. An ultra-high speed semiconductor phototransistor comprising:
   a substrate;
   a conductive collector layer having a collector electrode and formed on said substrate;
   a collector barrier layer formed on said conductive collector layer, said collector barrier layer further comprising:
      a resonant tunneling double-barrier structure for passing through the double-barrier quantum-well confined states only electrons, which were excited by a predetermined frequency in the emitter region;
      a blocking barrier layer positioned beneath said resonant tunneling double-barrier structure for reducing a dark current passed through said resonant tunneling double-barrier structure;
      a first buffer layer for absorbing electric potential change, said first buffer layer positioned beneath said blocking barrier layer for absorbing an electric potential change inside said resonant tunneling double-barrier structure;
   a conductive base layer having a base electrode and formed on said collector electric potential barrier layer;
   an emitter barrier layer formed on said conductive base layer for injecting hot-electrons onto said conductive base layer; and
   a conductive emitter layer having an emitter electrode and formed on said emitter barrier layer, said emitter barrier layer further comprising:
      a first spacer layer positioned between the emitter layer and the emitter barrier structure;
      various sizes of quantum dot array combination structures positioned beneath said first spacer layer for absorbing an infrared photon;
      a blocking barrier layer positioned beneath said quantum dot array combination structures for reducing a dark current passed through said quantum dot array combination structure; and
      a second buffer layer positioned beneath said blocking barrier layer for absorbing and electric potential change due to a voltage drop when external voltage is applied inside said quantum dot array combination structure.

11. The ultra-high speed semiconductor device according to claim 10, wherein said collector barrier layer further comprises a second spacer layer positioned on said resonant tunneling double-barrier structure.

12. The ultra-high speed semiconductor device according to claim 10, wherein said quantum dot array combination structures are constituted with a horizontal, vertical combination.

13. The ultra-high speed semiconductor device according to claim 10, wherein at least two or more quantum-well structures are used instead of said resonant tunneling double-barrier structure.

14. The ultra-high speed semiconductor phototransistor according to claim 10, wherein said first and second buffer layers have widths which can be adjusted for absorbing a change in the electric potential of one of an infrared photon detection quantum dot array combination structure, a quantum wire array combination structure and a collector resonant tunneling double-barrier quantum-well structure.

15. An ultra-high speed semiconductor phototransistor comprising:
   a substrate;
   a conductive collector layer having a collector electrode and formed on said substrate;
   a collector barrier layer formed on said conductive collector layer;
   a conductive base layer having a base electrode and formed on said collector electric potential barrier layer;
   an emitter barrier layer formed on said conductive base layer for injecting hot-electrons into said conducive base layer; and
   a conductive emitter layer having an emitter electrode and formed on said emitter barrier layer, said emitter barrier layer further comprising:
      a spacer layer between said conductive emitter layer and said emitter barrier structure;
      various sizes of quantum dot array combination structures positioned beneath said spacer layer for absorbing infrared photons;
      a blocking barrier layer positioned beneath said quantum dot array combination structures for reducing a dark current passed through said quantum dot array combination structure; and
      a second buffer layer positioned beneath said blocking barrier layer for absorbing an electric potential change due to a voltage drop when external voltage is applied inside said quantum dot array combination structure.

16. The ultra-high speed semiconductor device according to claim 15, wherein said quantum dot array combination structures are constituted with a horizontal, vertical combination.

17. The ultra-high speed semiconductor phototransistor according to claim 15, wherein said buffer layer has a width which can be adjusted for absorbing a change in the electric potential of one of an infrared photon detection quantum dot array combination structure a quantum wire array combination structure and a collector resonant tunneling double-barrier quantum-well structure.

* * * * *